Figure 1:
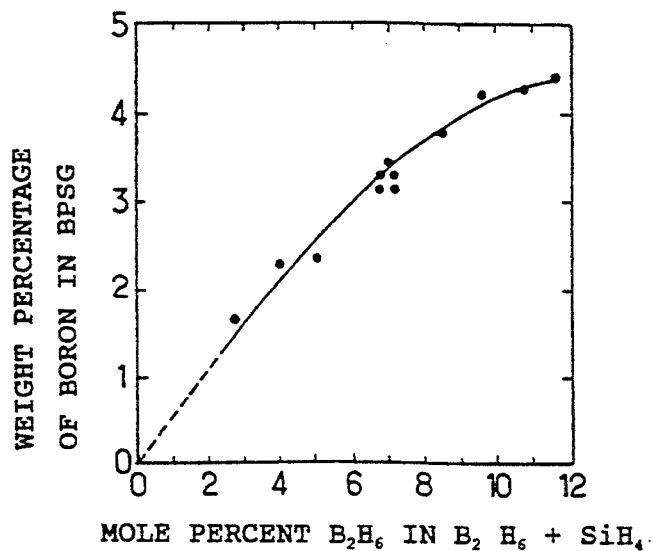

United States Patent [19]
Charpentier

[11] Patent Number: 5,441,893
[45] Date of Patent: Aug. 15, 1995

[54] METHOD FOR MONITORING THE BORON CONTENT OF BOROPHOSPHOSILICATE

[75] Inventor: Alain Y. P. Charpentier, Nantes, France

[73] Assignee: Matra MHS, Nantes, France

[21] Appl. No.: 221,965

[22] Filed: Apr. 4, 1994

[30] Foreign Application Priority Data

Apr. 6, 1993 [FR]  France ................... 93 04069

[51] Int. Cl.[6] ............................................ G01N 35/06
[52] U.S. Cl. ................................. 436/144; 436/163;
436/52; 436/53; 422/81; 422/105; 422/108;
422/110; 422/111
[58] Field of Search .................. 436/144, 163, 52, 53;
422/81, 105, 108, 110, 111

[56] References Cited

U.S. PATENT DOCUMENTS

| | | | |
|---|---|---|---|
| 4,226,898 | 10/1980 | Ovshinsky et al. | 427/39 |
| 4,369,031 | 1/1983 | Goldman et al. | 432/198 |
| 4,379,943 | 4/1983 | Yang et al. | 136/249 |
| 4,446,168 | 5/1984 | Kato et al. | 427/39 |
| 4,532,196 | 7/1985 | Yasui et al. | 430/31 |
| 4,557,950 | 12/1985 | Foster et al. | 427/255 |
| 4,791,005 | 12/1988 | Becker et al. | 427/255.3 |
| 4,845,043 | 7/1989 | Catalano | 437/4 |
| 5,187,134 | 2/1993 | Panster et al. | 502/158 |
| 5,200,043 | 4/1993 | Ooe et al. | 204/130 |
| 5,231,047 | 7/1993 | Ovshinsky et al. | 437/101 |

FOREIGN PATENT DOCUMENTS 3290395 12/1991 Japan .
2124767 2/1984 United Kingdom .

OTHER PUBLICATIONS

Kern et al, "Optimized chemical vapour deposition of borophosphosilicate films", RCA Review, vol. 46, No 2, pp. 117–152, Jun. 1985.
Kern et al, "Chemical vapour deposition of silicate glasses for use with silicon devices", J. Electrochem. Soc:Electrochemical Techn., vol. 117, No 4, pp. 562–568, Apr. 1970.

Primary Examiner—James C. Housel
Assistant Examiner—Sharidan Carrillo
Attorney, Agent, or Firm—Larson and Taylor

[57] ABSTRACT

A method for monitoring the boron content of the borophosphosilicate, BPSG. The BPSG is obtained by the oxidation of silane, of diborane and of phosphine in a reactor, starting with a first, diborane/silane gas mixture and a second, phosphine/silane gas mixture by monitoring the ratio $p=$diborane/(diborane+silane) of the mixture resulting from the mixing of the first and second gas mixtures. Monitoring of the boron content is obtained by measuring the density of the first mixture, determining the amount of residual hydrogen in the first mixture and modulating the mass flow rate of the first mixture in response to the calculated ratio $p$.

2 Claims, 3 Drawing Sheets

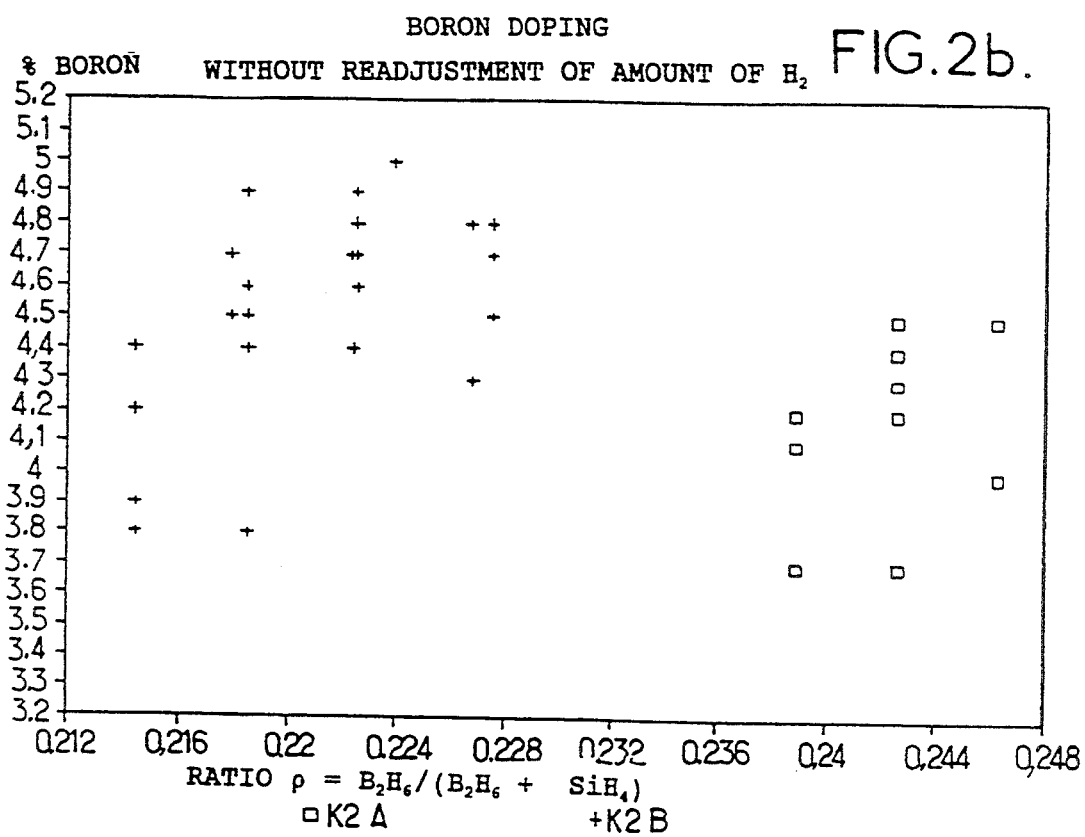
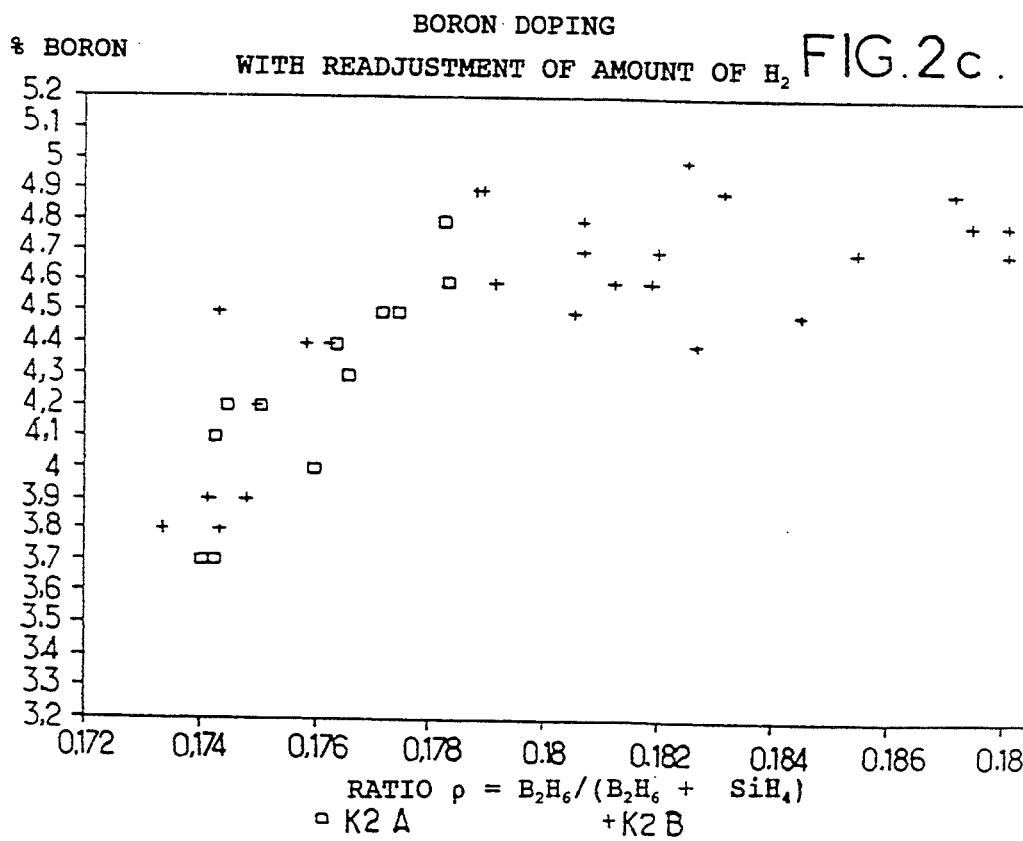

METHOD FOR MONITORING THE BORON CONTENT OF BOROPHOSPHOSILICATE

Borophosphosilicate is commonly used in the microelectronics industry, in an amorphous form designated by the term "borophosphosilicate glass" or BPSG, as insulating oxide before the first metal deposition intended to form a first level of electrical connection of the integrated circuits.

This material is useful in two ways. In the first place, it causes a getter, that is a protective, effect of the phosphorus from contaminations by alkaline ions and, in the second place, a decrease in the temperature necessary for obtaining a planarization effect by a plastic-flow operation, because of the introduction of boron.

The planarization effect obtained after the plastic-flow operation is linked directly to the boron content of the borophosphosilicate or BPSG. The monitoring, control and reproducibility of this content are therefore essential parameters of the manufacturing quality of the integrated circuits finally obtained.

At the present time, BPSG is obtained from the oxidation of silane, $SiH_4$, of diborane $B_2H_6$ and of phosphine $PH_3$ in a reactor of the LPCVD chemical vapor deposition type. For essential safety reasons, silane bursting into flames in a virtually spontaneous manner in free air, the diborane and phosphine are contained in bottles as a mixture having 30% of diborane for 70% of silane and respectively 30% of phosphine for 70% of silane. The boron content doping of the BPSG is monitored using the borane/(diborane+silane) ratio from the graph represented in FIG. 1.

Under these conditions, the problems encountered in monitoring the boron content of the BPSG are of two kinds.

In the first place, it is necessary to alter, in particular to increase, in a substantially monotonic manner, the diborane/silane mixture flow rate throughout the period of use of the bottle containing this diborane/silane mixture and to check each alteration or correction by an operation of measuring the boron content of the BPSG. This, necessary, operation is tricky and tedious and, in any case, makes possible only an approximate, temporary by default, adjustment, the correct adjustment conditions being effectively obtained only for a fraction of each temporary adjustment range.

In the second place, when changing the diborane supply bottle, the reproducibility of the successive adjustments is poor, this necessarily leading to essential adjustment operations which are costly in time and are therefore chargeable to the production time of each reactor.

The object of the present invention is to overcome the aforementioned drawbacks, so as to make possible the implementation of a truly industrial process for manufacturing borophosphosilicate, BPSG.

Another object of the present invention is also to furnish an entirely automated process for manufacturing borophosphosilicate, BPSG, human intervention being able to be reduced just to the changing of the gas or gas-mixture supply bottles, by virtue of the implementation of a method and of a device for monitoring the boron content of borophosphosilicate, BPSG, which are completely autonomous.

The method for monitoring the boron content of the borophosphosilicate, BPSG, obtained by oxidation of silane, of diborane and of phosphine in a reactor, starting with a first, diborane/silane gas mixture and a second, phosphine/silane gas mixture, by monitoring the ratio $\rho$=diborane/(diborane+silane) of the mixture resulting from the mixing of the first and second gas mixtures, which is the subject of the present invention, is noteworthy in that it consists in measuring, in the first mixture, the amount of residual hydrogen, then in modulating the mass flow rate of the first mixture as a function of the value of the amount of residual hydrogen, thereby making it possible to regulate the boron content of the borophosphosilicate thus obtained by monitoring the ratio $\rho$=diborane/(diborane+silane).

The device for monitoring the boron content of the borophosphosilicate, BPSG, obtained by oxidation of silane, of diborane and of phosphine in a reactor, supplied from a line for supplying a first, diborane/silane gas mixture, a second, phosphine/silane gas mixture and a flow of silane, in accordance with the method according to the invention, is noteworthy in that it comprises a circuit for measuring the density of the first mixture, delivering a density measurement signal for the first mixture, circuits for measuring the mass flow rate of the first and second mixture respectively together with the flow of silane, these measurement circuits being connected up to the corresponding supply line of the reactor, each measurement circuit delivering a corresponding mass flow-rate measurement signal, a circuit for controlling the mass flow rate of the first mixture, connected up to the first-mixture supply line of the reactor. A computer is provided which receives the density measurement signal for the first mixture and the mass flow-rate signals for the first and second mixture and for the flow of silane and delivers a mass flow-rate correction control signal to the control circuit, thereby making it possible to regulate, on the one hand, the value of the ratio $\rho$=diborane/(diborane+silane) and, on the other hand, the boron content of the borophosphosilicate obtained in the reactor, by means of monitoring the residual hydrogen content of the first mixture.

The method and the device which are the subject of the present invention find application in the manufacture of integrated circuits.

Figure 2A:
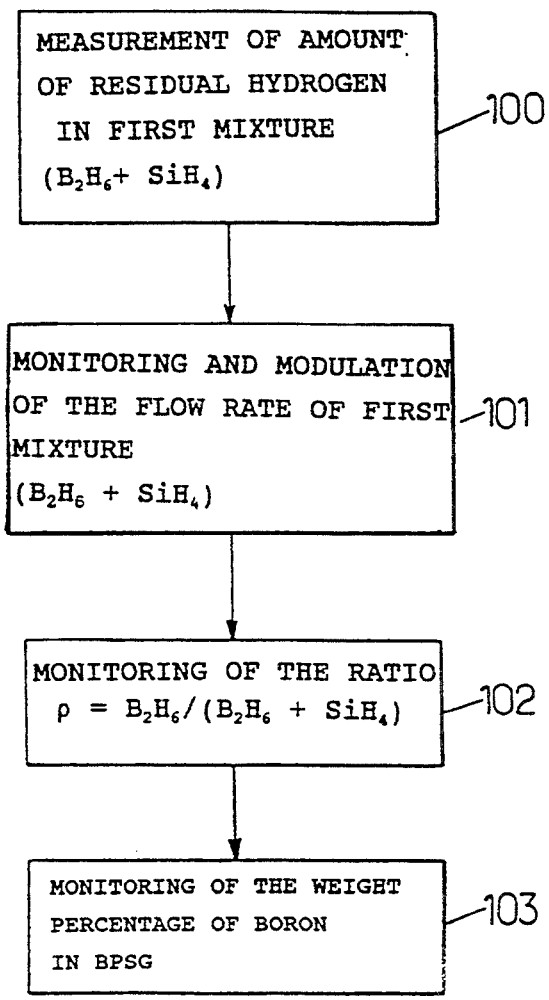
Figure 3:
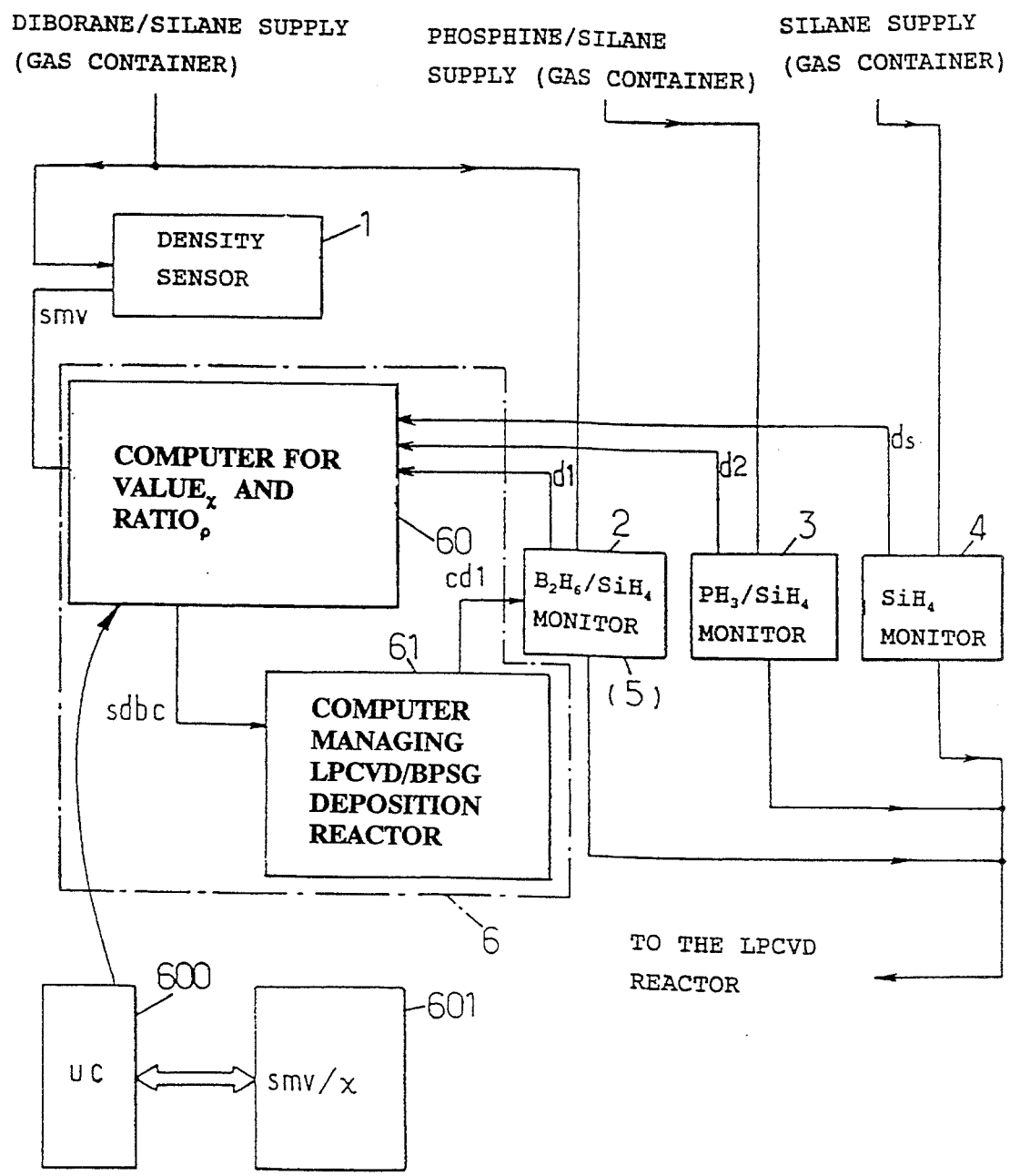

They will be better understood upon reading the description and upon looking at the drawings hereinbelow in which, in addition to FIG. 1 relating to the prior art, FIG. 2a represents a diagram, in block-diagram form, illustrating the implementation of the method which is the subject of the present invention, FIGS. 2b and 2c represent by way of illustration a diagram of the resulting boron concentration of the borophosphosilicate, BPSG, obtained, in the absence of implementation of the method which is the subject of the invention and respectively during the implementation of the method as illustrated in FIG. 2a, FIG. 3 represents a diagram illustrating a device making possible the implementation of the method which is the subject of the invention.

A more detailed description of the method which is the subject of the present invention will now be given in conjunction with FIG. 2a and the following figures.

The borophosphosilicate, BPSG, is obtained by oxidation of silane $SiH_4$, of diborane $B_2H_6$ and phosphine $PH_3$ in a reactor of the LPCVD chemical vapor deposition type. The aforementioned gases are brought into the reactor in the form of a first, diborane/silane gas mixture and a second, phosphine/silane gas mixture, a flow of pure silane being able, as required, to be also delivered to the aforementioned reactor.

The method for monitoring the boron content of the borophosphosilicate, according to the present invention is carried out by monitoring the ratio $\rho=$ diborane/(diborane+silane) of the mixture resulting from the mixing of the first and second gas mixtures in the reactor.

According to one particularly advantageous aspect of the method which is the subject of the present invention, the method consists in measuring at a step denoted by 100 in FIG. 2a, in the first mixture, the amount of residual hydrogen, then in modulating, in a step denoted by 101, the mass flow rate of the first mixture as a function of the value of the amount of residual hydrogen in the latter.

It is pointed out that the residual hydrogen appears in this first mixture because of the decomposition of the diborane into heavy boranes and into hydrogen. Consequently, the residual hydrogen content of the first mixture is, of course, representative of the mass composition of this mixture, thereby making it thus possible, by the measurement of the density of this first mixture, to determine the composition of the first mixture and therefore the diborane contribution in the first mixture.

The monitoring and modulation of the first-mixture flow rate, at step 101 represented in FIG. 2a, therefore makes it possible at a step 102 to carry out the monitoring of the ratio $\rho=$ diborane/(diborane+silane) and finally the monitoring of the percentage by weight of boron in the borophosphosilicate, BPSG, at step 103.

In a general manner, it is pointed out that the first mixture is a mixture having G % of diborane and 100−G % of silane, the second mixture being a mixture having G % of phosphine and 100−G % of silane.

Under these conditions, in accordance with the method which is the subject of the present invention, the amount of hydrogen measured in the first mixture has a value $\chi$, this value being determined by correspondence with the density measurement of this first mixture and the ratio $\rho=$ diborane/(diborane+silane) satisfies the equation:

$$\rho=[(G/100-X)\cdot A]/[(G/100-X)\cdot A+E+(100-G)/100(A+D)]$$

In this equation,

G designates the percentage of diborane in the first mixture

A designated the flow-rate of the first mixture,

D designates the flow-rate of the second mixture,

E designates the flow-rate of the silane, it being understood that the measure flow rates are mass flow rates, X designates the amount of residual hydrogen in the first mixture.

In the usual manner, and for the containment of the various mixtures previously indicated in the description, it is pointed out that G=30.

Experimental tests have been carried out by taking into account the amount of hydrogen in the line and by assuming that the first mixture and the second mixture are contained and delivered under the previously mentioned conditions.

The results obtained in a LPCVD-type reactor, for two successive different supply bottles throughout the duration of their use, are represented in FIG. 2b and 2c, the two successive bottles used being, of course, any commercially available bottles, FIGS. 2b and 2c representing the boron percentage curves in the borophosilicate as a function of the ratio $\rho=$ diborane/(diborane+silane), the boron content being measured by colorimetry (chemical attack). On the aforementioned curves, the K2A and K2B annotations correspond respectively to the two successive bottles of the first mixture tested and to a variation of from 5 to 10% and from 3 to 7% in the hydrogen content over the period of use, that is to say over approximately two months. FIG. 2b does not take into account the amount of residual hydrogen and the diborane/(diborane+silane) ratio $\rho$ is computed using the formula below:

diborane/diborane+silane=$(0.3\times A)/(0.3\times A+E+0.7\times(A+D))$.

On the other hand, FIG. 2c takes into account the amount of residual hydrogen in the diborane/silane first-mixture supply line. The ratio $\rho=$ diborane/(diborane+silane) is computed using the equation given previously in the description.

In the first place, good agreement is observed between the curves plotted for the two successive bottles compared to those indicated in the state of the art, in particular in the publication entitled "Optimized chemical vapor deposition of borophosphosilicate glass films" by W. Kern, W. A. Kurylo and C. J. Tino, R.C.D. Review 46,(2), June 1985, page 117.

The existence of identical behavior from one bottle to the other is also observed. In the case of FIG. 2b, that is to say in the absence of flow-rate readjustment of the first mixture as a function of the residual-hydrogen content of the first mixture, the observed cloud of points does not make it possible to control the boron content of the borophosphosilicate, BPSG.

On the other hand, in the case of FIG. 2c, the readjustment of the flow rate as a function of the amount of residual hydrogen in the first mixture makes it possible to evaluate and to readjust the ratio $\rho=$ diborane/(diborane+silane) and thus to monitor the boron content of the borophosphosilicate obtained in the reactor.

It is pointed out that the measurement of the amount of residual hydrogen in the first mixture and the application of the equation enabling the ratio $\rho=$ diborane/(diborane+silane) to be determined makes it possible to monitor the boron content and to ensure reproducibility over the lifetime of a bottle of the diborane/silane mixture or first mixture, as well as from one bottle to another.

A more detailed description of a device making possible the implementation of the method, which is the subject of the present invention, described previously, will now be given in conjunction with FIG. 3.

According to the aforementioned figure, the device for monitoring the boron content of the borophosphosilicate, BPSG, obtained by oxidation of silane, of diborane and of phosphine in a reactor, this reactor, not represented in FIG. 3, being supplied from a line for supplying a first, diborane/silane gas mixture, a second, phosphine/silane gas mixture and a flow of silane, and this monitoring being carried out by monitoring the ratio $\rho=$ diborane/(diborane+silane) of the resulting mixture, in accordance with the method previously described in the description, comprises, in an illustrative non-limiting manner, a circuit or sensor 1 for the density of the first mixture, connected up, for example in parallel, to the first-mixture supply line of the reactor, this sensor circuit 1 delivering a density measurement signal for the first aforementioned mixture. This signal is denoted by smv.

The device according to the invention also includes measurement circuits denoted by 2, 3, 4 for the mass flow rate of the first and respectively second mixture, as well as of the flow of silane, these measurement circuits being connected up to the corresponding supply line of the reactor. Each circuit delivers a corresponding mass flow-rate measurement signal which, for convenience, are denoted by d1, d2, ds.

Furthermore, the device represented in FIG. 3 comprises a control circuit, denoted by (5), for controlling the mass flow rate of the first mixture, connected up to the first-mixture supply line of the reactor. Finally, a computer 6 receives the density measurement signal smv for the first mixture as well as the mass flow-rate signals d1, d2, ds for the first and second mixture respectively of the flow of silane, this computer delivering a mass flow-rate correction control signal, denoted by cd1, to the control circuit (5), thereby making it possible to regulate, on the one hand, the value of the ratio $\rho$=diborane/(diborane+silane) and, on the other hand, the boron content of the borophosphosilicate obtained in the reactor by means of the monitoring of the residual-hydrogen content of the first mixture.

In a preferential embodiment, it is pointed out that the measurement circuit 2 and the control circuit (5) for controlling the mass flow rate of the first mixture are constituted by the same mass flow meter. In a particular non-limiting embodiment, the circuits 2, 3, 4 and 5 are constituted by a mass flow meter marketed by the TYLAN Company under the reference FC 280.

In the same embodiment, it is pointed out that the circuit 1 for measuring the density of the first mixture was constituted by an apparatus marketed by the SARASOTA Company under the reference CBYT FD 771.

In a preferential embodiment as represented in FIG. 3, the computer 6 may advantageously comprise an auxiliary computer 60 receiving the density measurement signals for the first mixture as well as the mass flowrate signals D1, D2, Ds and making it possible to determine, from the aforementioned signals, the value $\chi$ of the amount of residual hydrogen in the first mixture as well as the value $\rho$ of the diborane/(diborane+silane) ratio verifying the equation previously mentioned in the description.

In this case, the computer 6 advantageously includes a master computer denoted by 61 which receives the corrected flow-rate signal denoted by sdbc, for the first mixture, and delivers the mass flow-rate correction control signal denoted by cd1 to the control circuit (5).

Preferably, it is pointed out that the auxiliary computer 60 may be constituted by a dedicated computer which may include a consultation table 601 connected to a central unit 600 which makes it possible, by direct reading of the consultation table, to determine the residual-hydrogen content of the first mixture from the density of the latter.

Of course, the auxiliary computer 60 may be replaced, for example, by a portable microcomputer into which the corresponding programs or data are also loaded.

As regards the construction of the device represented in FIG. 3, it is pointed out that the various density or mass flow-rate measurement sensors of the first mixture respectively of the first and second mixtures and of the flow of silane, are sampling circuits and that the density sampling period for the first mixture is, for example, between 10 and 15 minutes, whereas the mass flow-rate sampling period is, for example, between 1 to 3 minutes.

A method and a device have thus been described for monitoring the boron content of the borophosphosilicate used in the production of particularly high-performance integrated circuits insofar as it suffices, for a desired boron content, to maintain the diborane/(diborane+silane) ratio constant, by coupling the modification of the diborane/silane mass flow rate to the variation in the amount of residual hydrogen measured in the diborane/silane first-mixture supply line. The measurement of the boron content by colorimetry in the course of the process for manufacturing the corresponding integrated circuits is then no longer necessary.

I claim:

1. A method for monitoring the boron content of the borophosphosilicate obtained by oxidation of silane, of diborane and of phosphine in a reactor, starting with a first, diborane/silane gas mixture and a second, phosphine/silane gas mixture by monitoring the ratio $\rho$=diborane/(diborane+silane) of the mixture resulting from the mixing of the first and second gas mixtures, wherein said method comprises:

measuring the density of said first mixture,
determining the amount of residual hydrogen $H_2$ in said first mixture from the measured density,
calculating the ratio $\rho$=diborane/(diborane+silane) using the determined amount of residual $H_2$,
modulating the mass flow rate of said first mixture, in response to the calculated ratio $\rho$, to regulate the boron content of the borophosphosilicate.

2. The method according to claim 1, wherein said first mixture comprises of G% of diborane and (100−G) % of silane, said second mixture having G% of phosphine and (100−G) % of silane, the amount of hydrogen measured in said first mixture having a value X, the ratio $\rho$=diborane/(diborane+silane) satisfying the equation:

$$\rho = [(G/100 - X) \cdot A]/[(G/100 - X) \cdot A + E + (100 - G)/100(A + D)]$$

wherein the following components are defined:

G designates the percentage of diborane in the first mixture
A designates the flow-rate of the first mixture
D designates the flow-rate of the second mixture
E designates the flow-rate of the silane
X designates the amount of residual hydrogen in the first mixture

* * * * *